United States Patent [19]

Inata et al.

[11] Patent Number: 4,593,301
[45] Date of Patent: Jun. 3, 1986

[54] HIGH ELECTRON MOBILITY SEMICONDUCTOR DEVICE EMPLOYING SELECTIVELY DOPED HETEROJUNCTION AND DUAL, UNDOPED SPACER LAYERS

[75] Inventors: Tsuguo Inata; Shigehiko Sasa, both of Isehara, Japan

[73] Assignee: Fujitsu Limited, Kawasaki, Japan

[21] Appl. No.: 707,290

[22] Filed: Mar. 1, 1985

[30] Foreign Application Priority Data

Mar. 8, 1984 [JP] Japan .................. 59-44501

[51] Int. Cl.$^4$ ........................... H01L 29/80
[52] U.S. Cl. .......................... 357/22; 357/4; 357/16; 357/55; 357/58; 357/89
[58] Field of Search .............. 357/22, 16, 55, 22, 357/58, 89, 4

[56] References Cited

U.S. PATENT DOCUMENTS 4,163,237 7/1979 Dingle et al. .................. 357/22

Primary Examiner—Joseph E. Clawson, Jr.
Attorney, Agent, or Firm—Armstrong, Nikaido, Marmelstein & Kubovcik

[57] ABSTRACT

In order to make IC comprising high electron mobility semiconductor device, it is necessary to make the carrier in channel layer not to loose its high mobility by thermal treatment in the IC fabrication process. It has been found that the mobility of two dimensional electron gas (2DEG) is lost by scattering of ionized impurity diffused from doped layer into spacer layer which separates the 2DEG in channel layer from the doped layer. So another spacer (second spacer) is inserted between the spacer (first spacer) and the doped layer to prevent the diffusion of impurity. Proposed multilayered structure is as follows. A channel layer made of i-GaAs is formed on a high resistivity GaAs substrate. Upon which a first spacer layer (prior art) of undoped $Al_xGa_{1-x}As$ is formed, over which the second spacer layer of i-GaAs is formed, then over which the doped layer of n-$Al_xGa_{1-x}As$ is formed. The thickness of the second spacer layer is approximately 20 Å, and that of the first spacer is approximately 40 Å. Applying such structure to the high electron mobility transistor, it could bear the heat treatment of 750° C. 10 min. and more that 950° C. 10 sec. annealing.

11 Claims, 10 Drawing Figures

HIGH ELECTRON MOBILITY SEMICONDUCTOR DEVICE EMPLOYING SELECTIVELY DOPED HETEROJUNCTION AND DUAL, UNDOPED SPACER LAYERS

TECHNICAL FIELD

This invention relates to a semiconductor device with enhanced mobility employing selectively doped heterojunction, especially to a structure of device which enables to treat the device with high temperature without disturbing electron mobility of two-dimensional electron gas, in order to install the device in IC.

PRIOR ART

The following patents are representative of the prior art in the area of high electron mobility semiconductor devices:

U.S. Pat. No. 3,626,257 of Esaki et al, suggests various kinds of superlattices made by modulating the bandgap or doping so that the multilayered structure exhibits negative resistance;

U.S. Pat. No. 4,163,237 of Dingle et al. suggests buffer zones which is substantially free of impurities adjacent the heterojunctions, in order to further reduce impurity scattering; and Japanese laid open patents Provisional Publication Nos. 57-193067, 58-51573, 58-51574 and 58-51575 suggest improvements for impurity scattering and heat treatment.

BACKGROUND OF THE INVENTION

Silicon semiconductor devices are now playing the leading part of electronic equipments. But on other hand new material is looked for to further improve the operation speed of the devices. Gallium arsenide (GaAs) is one of such new material which has capability to realize higher operating speed because of its higher electron mobility than that of silicon, and devices using such material is now under development.

As a device utilizing compound semiconductor such as gallium arsenide, field effect transistor (FET) is ahead of development because its fabrication process is simple compared to that of bipolar transistor. Especially schottky barrier type FET whose parasitic capacitance is reduced by using semi-insulating substrate of compound semiconductor is becoming a main stream of the development.

In normal structured semiconductor devices of silicon or gallium arsenide, carriers move through semiconductor lattice space where impurity ions are existing. Motion of the carrier is affected by lattice and impurity ions, and loose is mobility by collision and scattering with them. It is possible to decrease the effect of scattering by lattice (interaction with phonon) by decreasing the temperature, but it increases the scattering by impurity ions so the mobility of the carrier is limited.

In order to sustain the high electron mobility especially in cryogenic temperature by eliminating the effect of ionized impurity scattering, multilayered structure has been proposed (for example U.S. Pat. No. 3,626,257 by Esaki et al.), interleaving layers having different bandgap each other. Such structure intends to separate the layer where the carriers drift (it is called as channel layer) from the layer where impurity is doped to supply the carriers. Such separation is done by heterojunction between the layers, so it is called as selectively doped (or modulation doped) heterojunction FET or high electron mobility transistor (HEMT).

In order to make clear the advantage of the present invention, structure of prior art heterojunction FET, its problems, and some attempts to improve them will be described briefly. FIG. 1 shows two types of prior art heterojunction FETs. In the FIG. 1 is a semi-insulating gallium arsenide (GaAs) substrate, in some cases it is intentionally doped with chromium (Cr) or iron (Fe) etc. to compensate the effect of unintentionally doped impurities, and provide a very high resistivity. On the substrate 1 is piled in order from the surface of the substrate a undoped i-type GaAs layer 2, an aluminum-gallium arsenide ($Al_xGa_{1-x}As$) layer 3 which has smaller electron affinity compared to that of the layer 2, and an n-type GaAs layer 4. The n-type GaAs layer 4 is highly doped to secure a good contact with contact wires and shaped to form source and drain electrodes as shown in the figure. When gate electrode 5, source electrode 6 and drain electrode 7 are fabricated, the heterojunction FET is completed.

In the example of FIG. 1(a), the $Al_xGa_{1-x}As$ layer 3 is doped with silicon (Si), for example, and becomes n-type. Carriers (in this case is electron) formed in the doped layer 3 are transferred to the undoped layer 2 and accumulates in the layer 2 near the heterojunction between the i-type GaAs layer 2 and the $Al_xGa_{1-x}As$ layer 3, and forms two-dimensional electron gas 2A as shown in the figure. This two-dimensional electron gas (abbreviated as 2DEG) plays a role of channel in FET, and often called as channel layer. When the device is cooled to the cryogenic temperature, the lattice scattering decreases, and since the i-type GaAs layer 2 is not doped and ionized impurity is very rare, the 2DEG is not suffered from the scattering by the ions and it sustains high mobility. Thus high speed operation of the heterojunction FET is attained.

It was found that by the structure of FIG. 1(a) some of the carriers in the 2DEG 2A are affected by the ions in the $Al_xGa_{1-x}As$ layer 3, so the mobility of the carrier does not become sufficiently high. So it has been proposed to provide a buffer zone or spacer between the 2DEG and the carrier supplying layer (for example U.S. Pat No. 4,163,237). FIG. 1(b) shows an example of such structure. Compared to FIG. 1(a), the $Al_xGa_{1-x}As$ layer 3 is subdivided into two layers 3a and 3b. Contiguous with the i-type GaAs layer 2 is formed a thin layer of undoped $Al_xGa_{1-x}As$ layer 3a, which acts as the buffer zone or spacer. Over the buffer zone 3a is formed the carrier supplying layer 3b which is a Si doped layer for example. Thickness of the buffer zone is few tens of Å.

Applying such structure for GaAs devices, the mobility of 2DEG exhibited $1 \times 10^5$ cm$^2$/VS at 77° K., with a 2DEG concentration of $6 \times 10^{11}$ cm$^{-2}$ and the high speed operation of GaAs FET has been improved to a great extent. But there came out another problem. GaAs FET of the above mentioned structure has been fabricated with a process whose temperature is fairly low compared to ordinary semiconductor manufacturing process. For example the source or drain electrode has been fabricated with eutectic ally of gold and gold-germanium (AuGe/Au) whose eutectic temperature is 450° C., and the heating time has been kept to less than one minute. With such care, the thermal diffusion of impurities from the doped $Al_xGa_{1-x}As$ layer 3b into the spacer region of undoped $Al_xGa_{1-x}As$ layer 3a has been suppressed. If not, the impurity in the layer $3b$ will diffuse into the spacer layer $3a$, and the mobility is decreased by the interaction with the impurity ions.

By the way, recent electron devices are used in complex form with some other devices. Therefore, single FET is almost meaningless though it has very high speed, it must be used together with other devices, it must be weaved into IC or it must compose IC by itself. In order to use a high electron mobility transistor (HEMT) for practical use, therefore, it is necessary to make it strong to bear the process temperature of about 700° C. Such temperature is required for example for driving impurities into semiconductor material by diffusion, or annealing the device to activate the impurities implanted by ion implantation.

One easy way was applying a local heating by energy beam such as infrared ray, electron beam for example, but they were applicable only for limited use. Some attempts has been proposed (for example Japanese laid open patents Provisional Publication Nos. 57-193067, 58-51573, 58-51574 and 58-51575). One attempt was to make thick the spacer layer estimating the diffusion of impurities into the spacer by thermal diffusion, other one was to make additional layer of n-GaAs layer. Though these attempts have their own significances, but it is still insufficient to sustain the high electron mobility bearing high process temperature.

It is the main object of the present invention, therefore, to provide a structure of high electron mobility semiconductor devices which bears a process temperature of more than 700° C.

Another object of the present invention is to provide a high electron mobility transistor (HEMT) which can be used together with other electron devices as an integrated circuit.

SUMMARY OF THE INVENTION

The inventors noticed from experiments that the spacer layer of $Al_xGa_{1-x}As$ provides an effect to prevent the interaction between the ionized impurities in the doped layer of $Al_xGa_{1-x}As$ ($3b$ in FIG. $1(b)$), but it has no ability to prevent the diffusion of impurity ions from the layer $3b$, into the layer $3a$ (spacer). Moreover if the substrate is heated the impurity of Si distributed uniformly in the both $Al_xGa_{1-x}As$ layers of $3a$ and $3b$. So the effect of the spacer is lost. On the contrary the layer of undoped GaAs layer (i-GaAs) showed an effect to stop the diffusion of Si.

Based on above discovery, the inventors provided another spacer composed from undoped GaAs (i-GaAs) layer of approximately 20 Å thick over the prior art spacer of undoped $Al_xGa_{1-x}As$ (i-$Al_xGa_{1-x}As$) layer of approximately 40 Å thick. Over which the carrier supplying layer of Si doped n-$Al_xGa_{1-x}As$ has been fabricated.

Applying such configuration for the HEMT, it became possible to treat the substrate up to 750° C. for 20 minutes without being suffered from the decrease of mobility of 2DEG. And it became possible to compose HEMT in IC altogether with other electron devices.

BRIEF DESCRIPTION OF THE DRAWINGS

FIG. $1a$ and $1b$ show fundamental construction of multi-layered heterojunction device of prior art, in which.

(a) illustrate schematically a cross sectional view of multi-layered heterojunction FET; and (b) illustrate a structure further comprising a spacer layer.

FIG. $4a$ and $4b$ show the redistribution of Si in GaAs by thermal treatment, in which:

(a) shows the redistribution of Si in $Al_xGa_{1-x}As$ layer; and (b) shows that in GaAs layer.

Figure 5:
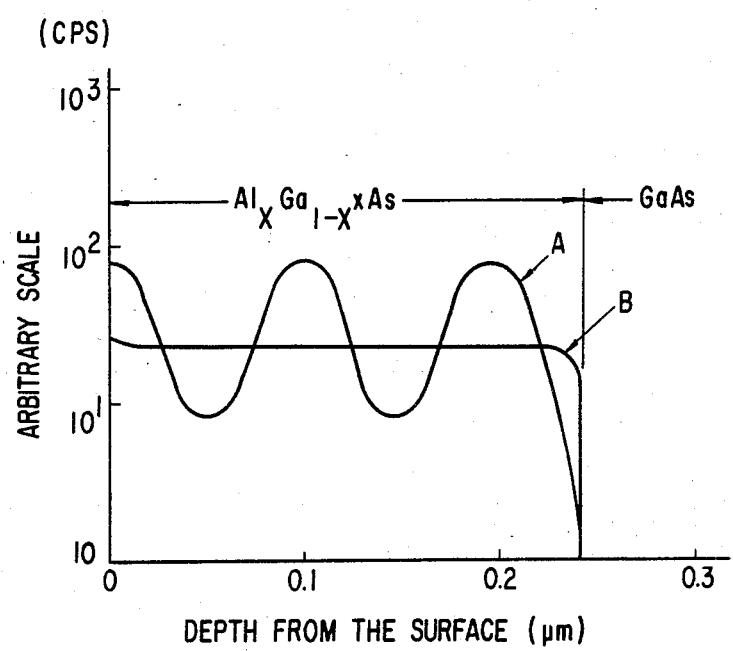

FIG. 5 is a graph to illustrate the stopping effect for diffusion of Si impurities by GaAs layer.

Figure 6:
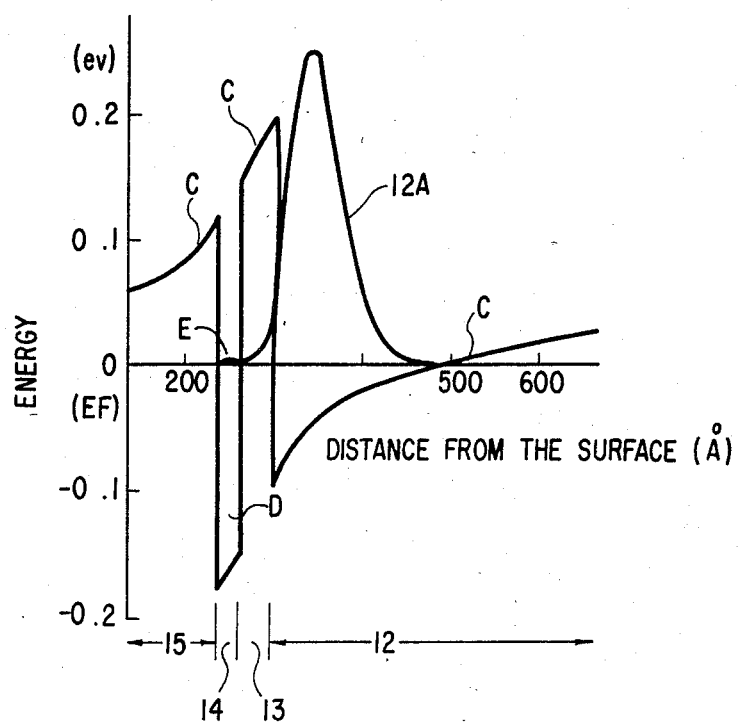

FIG. 6 is an example of computer simulated profile showing energy level and concentration of two dimensional electron gas for a structure of HEMT (high electron mobility transistor) proposed by the present invention.

Figure 7:
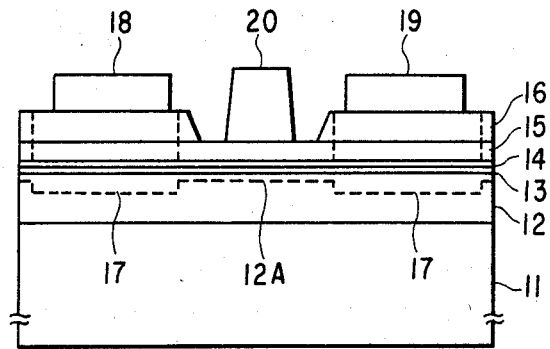

FIG. 7 shows schematically a cross sectional view of an embodiment of HEMT proposed by the present invention.

Figure 8:
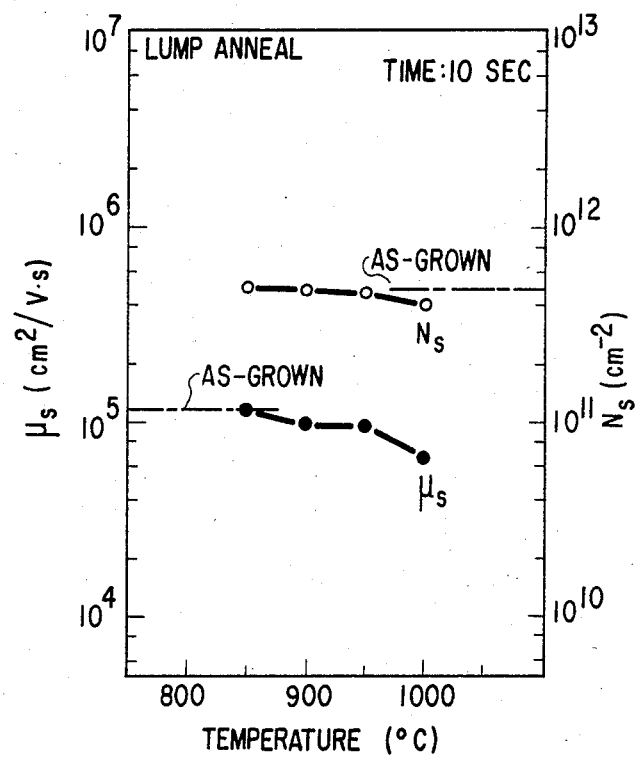
Figure 2:
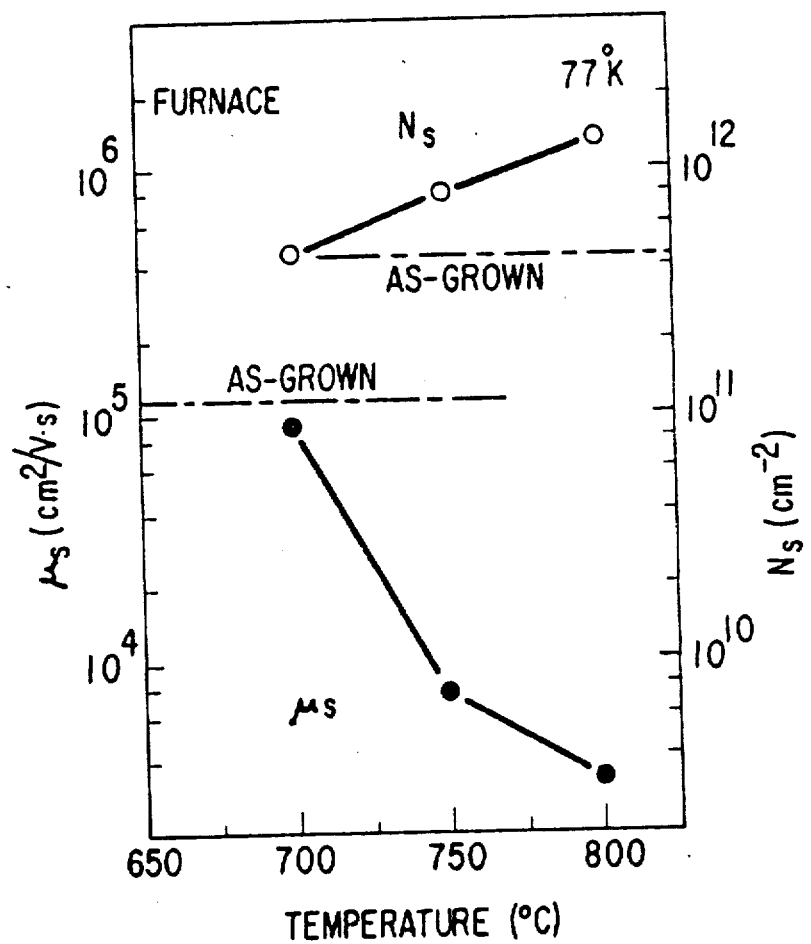
Figure 3:
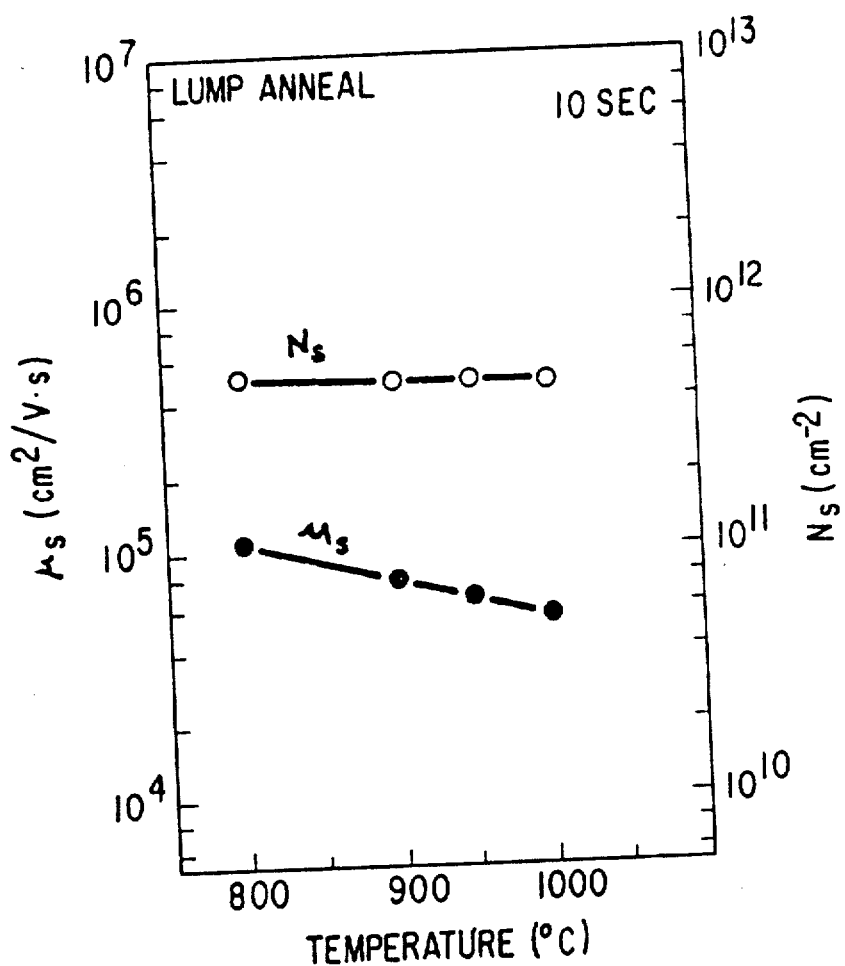
Figure 6:
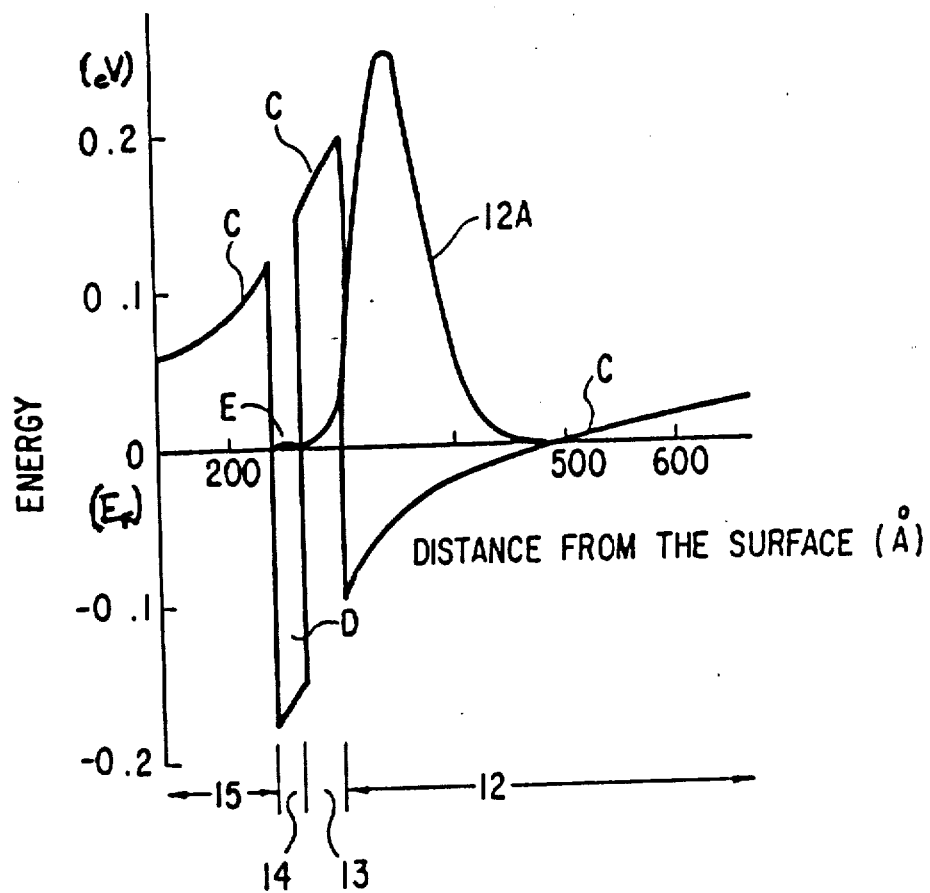

FIG. 8 is a graph showing that the multilayered device proposed by the present invention prevents 2DEG from decrease of mobility by thermal treatment.

DETAILED DESCRIPTION OF THE INVENTION

As mentioned before while investigating the variation of mobility against thermal treatment of the substrate, the inventors noticed that the undoped $Al_xGa_{1-x}As$ layer has no effect to prevent the diffusion of Si.

Figure 2:
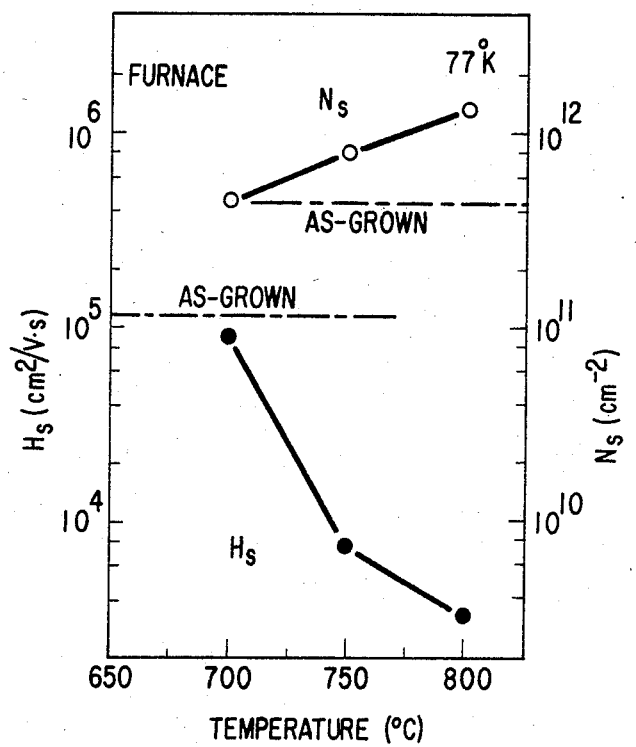
FIG. 2 shows an example of how the carrier mobility and carrier concentration of prior art heterojunction FET varies with thermal treatment (conventional furnace annealing).

At first the variation of carrier mobility $\mu_s$ and carrier concentration $N_s$ of 2DEG (two dimensional electron gas) has been measured at various temperatures. The substrate having the structure of FIG. $1(b)$ has been treated in conventional electric furnace for 20 minutes and the $\mu_s$ and $N_s$ has been measured at 77° K. An example is shown in FIG. 2. In the figure the abscissa shows the temperature and the ordinate shows $\mu_s$ or $N_s$. As can be seen in the figure, the mobility goes down and the advantage of the multilayered heterojunction device is lost as the treatment temperature is raised.

Figure 3:
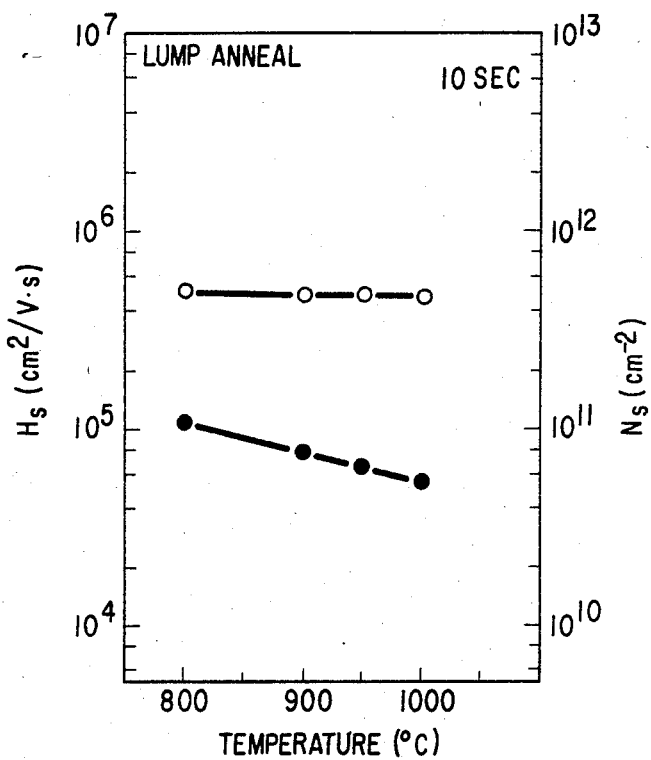
FIG. 3 is a graph showing that the mobility is decreased even by a short time thermal treatment of only 10 seconds (tungsten-halogen lamp treatment).

In order to avoid the heating effect the heating time has been reduced. For this purpose, a substrate having the same structure to the above case has been annealed by tungsten-halogen lamp heater for 10 seconds, and the $\mu_s$ and $N_s$ has been measured at 77° K. Reducing the heating time is an effective method often used to avoid the defects of heating. But as shown in FIG. 3, the mobility decreases even with a short time treatment of 10 seconds.

This is considered as due to the diffusion of Si into the spacer. So the diffusion of Si in aluminum gallium arsenide has been investigated. For this purpose, a layer of $Al_{0.3}Ga_{0.7}As$ has been grown on a high resistivity GaAs substrate by molecular beam epitaxy. During the growth the doping rate at various depth has been varied intentionally (such doping is sometimes called as modulated doping) as shown in FIG. $4(a)$. In the figure, the abscissa is a distance from the surface of the grown layer toward the substrate, and the ordinate is a carrier concentration measured by capacitance-voltage (C-V) method. The heavy line indicates the concentration of as grown layer. And the substrate has been thermally processed by tungsten-halogen lamps (1050° C., 10 s)

and by a conventional furnace (750° C. 20 min). The dotted curve and the broken line show the concentration after above treatments respectively. The curves show that Si is easily redistributed in the $Al_{0.3}Ga_{0.7}As$ layer by thermal diffusion. This indicates that the spacer layer is easily penetrated by Si impurity when it is thermally treated.

Figure 4A:
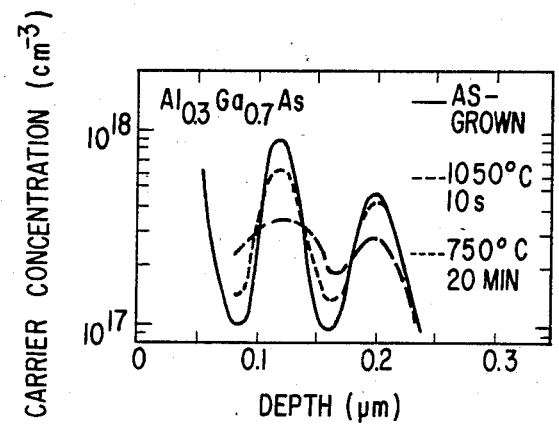
Figure 4B:
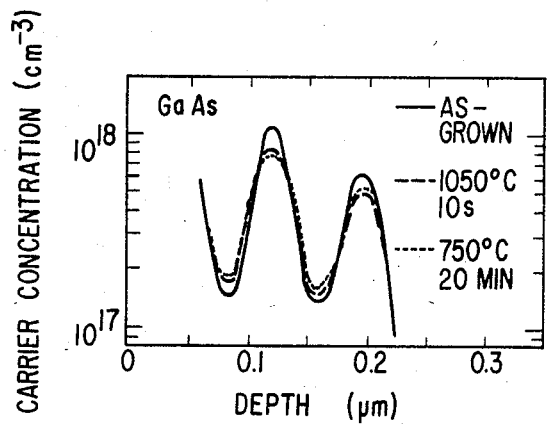

Similar investigation has been carried on with GaAs layers. In this case a GaAs layer has been grown on a high resistivity GaAs substrate by molecular beam epitaxy, and the doping has been varied with the same condition to that of FIG. 4(a). Measurement of carrier concentration has been done for the same condition. As shown in FIG. 4(b) the GaAs layer showed far less redistribution of Si in it compared to $Al_xGa_{1-x}As$. This indicates the possibility of spacer with undoped GaAs layer (i-GaAs layer).

Figure 1A:
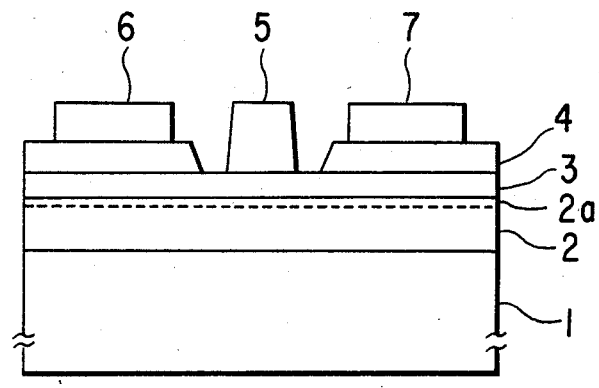
Figure 1B:
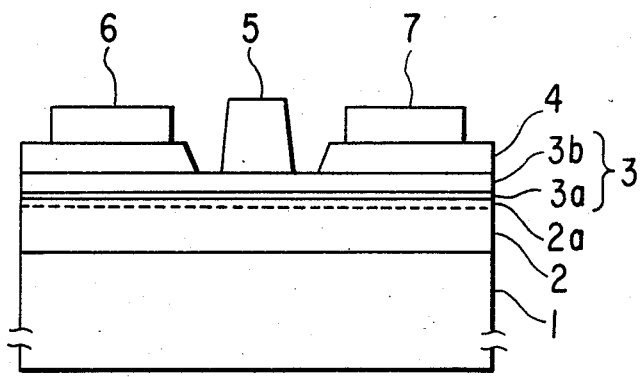

At first it is considered to replace the $Al_xGa_{1-x}As$ spacer with i-GaAs spacer. But it will be clear that such structure is no difference with the structure of FIG. 1(a), and the spacer itself becomes a channel layer, so the spacer effect is lost. The results of computer simulation of energy band diagram and carrier concentration of 2SEG showed a possibility that the i-GaAs should be used as the impurity stopper, and it should be placed between the $Al_xGa_{1-x}As$ spacer and the n-$Al_xGa_{1-x}As$ carrier supplying layer.

The stopping effect of impurity diffusion by the second spacer of the present invention is clear from the following experiment. On a GaAs substrate an undoped $Al_xGa_{1-x}As$ layer of 5,000 Å thick and an $Al_xGa_{1-x}As$ layer of 2,500 Å thick has been grown by molecular beam epitaxy, and the $Al_xGa_{1-x}As$ layer has been modulation doped as shown by curve A in FIG. 5. In the figure, the abscissa is distance from the surface of the $Al_xGa_{1-x}As$ layer toward the substrate, and ordinate is an arbitrary scale proportional to the impurity concentration. The substrate prepared in such manner has been cut into two parts, one part is measured its impurity distribution (curve A), the other part has been thermally treated at 750° C. for 80 minutes in a furnace, then the impurity distribution has been measured (curve B). The impurity (Si) concentration has been measured by secondary ion mass spectroscopy (SIMS).

As can be seen in the figure, the Si impurity in the $Al_xGa_{1-x}As$ layer is redistributed by the thermal treatment, but the diffusion of Si is stopped at the boundary of the GaAs layer and the concentration of Si decreases sharply (curve B). Therefore, spacer for stopping the impurity diffusion by i-GaAs is very effective.

Practical multilayered structure of the present invention has been determined from the simulation of energy band diagram and carrier concentration by the aid of computer. One example is shown in FIG. 6. It will be described later referring FIG. 7 an embodiment of HEMT (high electron mobility transistor) proposed by the present invention.

Based on above investigations and considerations the inventors propose an embodiment of HEMT as shown in FIG. 7. On a semi-insulating GaAs substrate 11, following layers are fabricated one after another by molecular beam epitaxial growth for example:

a undoped i-GaAs layer 12 of 0.5 μm, for example, upper part of which becomes a channel layer 12A;

the first spacer layer 13 made from an undoped i-$Al_xGa_{1-x}As$ layer of approximately 40 Å, whose aluminum composition x is 0.3 for example;

the second spacer layer 14 made from undoped i-GaAs of 20 Å thick for example;

an n-type $Al_xGa_{1-x}As$ layer 15 of approximately 600 Å thick, whose aluminum composition x is 0.3 for example, and doped with Si dose of approximately $1 \times 10^{18}$ $cm^{-3}$, this n-type $Al_xGa_{1-x}As$ layer 15 which supplies the carrier to the channel layer 12A; and an n-type GaAs layer 16 of approximately 500 Å thick and doped with silicon with a dose of $2 \times 10^{18}$ $cm^{-3}$ for example which provides a good ohmic contact with contact wire.

Into the source and drain regions 17 of the substrate, prepared as mentioned before, is implanted impurity of high dose with a depth which can reach to the i-GaAs layer 12. For example selenium (Se) is ion implanted with energy of 350 Kev with a dose of $1 \times 10^{14}$ $cm^{-2}$ at 200° C., and then annealed at 950° C. for 10 seconds with tungsten-halogen lump. By this annealing the n+ region 17 having carrier concentration of approximately $4-5 \times 10^{18}$ $cm^{-3}$ are formed.

Then by conventional method, the source electrode 18 and drain electrode 19 is fabricated. And recess is made in the n-GaAs layer 16 to which the gate electrode 20 is contacted.

FIG. 6 shows the energy band diagram and space distribution of 2DEG near the channel region. In the figure the abscissa is a distance from the surface of the n-$Al_xGa_{1-x}As$ layer 15, and ordinate is energy level. The broken curve C shows the energy level at each point of the cross section of FIG. 7. And curve 12A shows the concentration of 2DEG in an arbitrary scale. These curves are obtained by computer simulation. When the width of the spacers 14 and 13 are varied the 2DEG concentration varies. The curves of FIG. 6 corresponds to the embodiment described above with respect to FIG. 7, namely width of the first spacer 13 and the second spacer 14 are 40 Å and 20 Å respectively, which is consider to be favorable.

Total width of the both spacers should be less than 100 Å and desirable to be less than approximately 60 Å or less. If it is increased, the 2DEG concentration decreases, so the $g_m$ of the FET will decrease. On the contrary if the width of the spacers decreased the 2DEG concentration in the spacer layer 13 increases and the scattering by the impurity ions in the layer 15 increases, so the mobility decreases. For this reason, it is desirable that the spacer layer 13 has the thickness more than approximately 20 Å. Width of the second spacer layer 14 should be as narrow as possible. But if it is decreased too narrow, the diffusion of impurity occurs. Approximately 15 Å thickness is required. In such a manner the dimension of FIG. 7 has been determined.

Generally speaking, potential well D in FIG. 6 formed by the second spacer layer 14 has a probability to capture and accumulate carriers in it, but since its width is very thin the captured carrier (E in FIG. 6) by the potential well D is not so much. But if the width of the second spacer layer 14 increases the charge captured in the potential well increases and causes the impurity ion scattering then the mobility is decreases. Therefore, the width of the second spacer 14 layer is desirable to be approximately 30 Å or less.

A substrate having a structure of FIG. 7 has been thermal treated during is fabrication process including the treatment of 750° C. 10 minutes and lump annealing of 950° C., it has been further treated thermally for test with tungsten-halogen lamp for 10 second at various temperature, and the mobility and carrier concentration has been measured. FIG. 8 shows the results. Compared to the curves of FIG. 3, the mobility does not decreases at 900° C., and it keeps approximately this high value up to nearly 1,000° C. Recently such experiments have been reported in a convention of MRS (Materials Research Society) held in Boston Mass. on Nov. 26–30, 1984 by T. Tatsuta et al. including the inventors.

This indicates that the structure of the present invention improves the durability of the multilayered heterojunction device for higher temperature than that of prior art and keeps its high electron mobility. So the structure of the present invention is applicable for making ICs comprising high electron mobility transistors (HEMT).

Above disclosure has been done with respect to n-channel FET, because the mobility of electron is higher than that of hole, so for the high speed devices n-channel device has advantage compared to p-channel devices. But it will be clear for the one skilled in the art that the invention can be easily extended to p-channel devices. The materials, processes described with respect to the embodiment is not limited to them, any kind of material or technology suitable to fabricate the structure of the device proposed by the invention may be applicable. Moreover the heterojunction which accumulates the 2DEG to it (channel layer) is not limited to be only one layer, as has been suggested by prior art, multilayered channel which interleave plurality of heterojunction layers can be formed within the spirit and scope of the present invention.

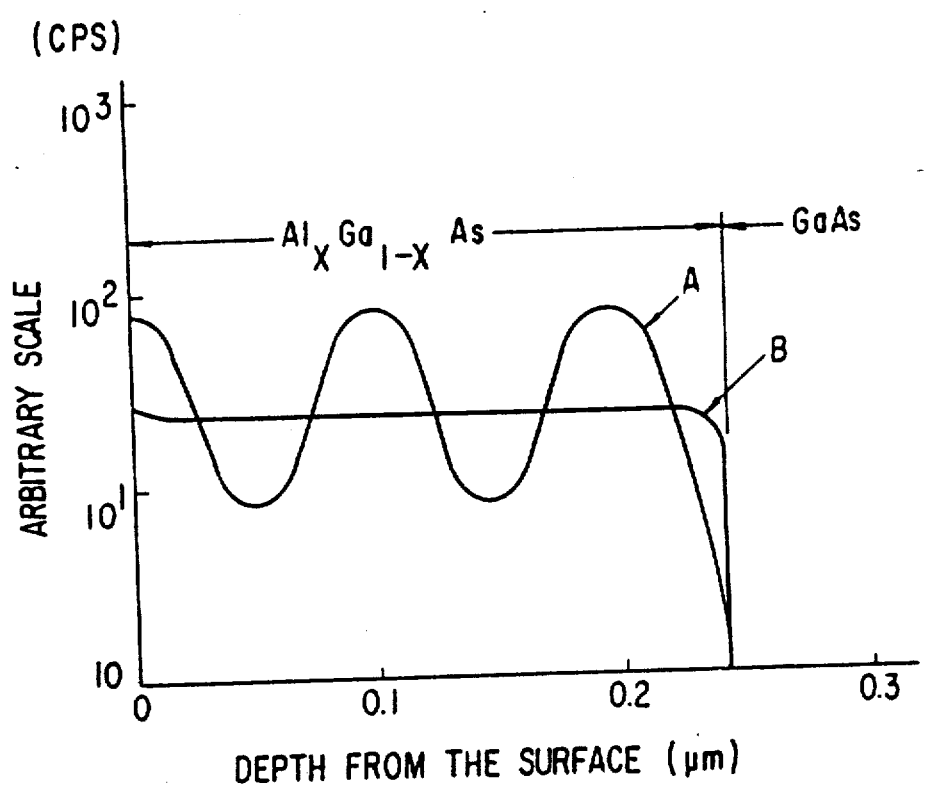

What we claim are as follows:

1. High electron mobility semiconductor device comprising:
    channel layer made from undoped gallium arsenide (i-GaAs) layer;
    first spacer layer made from undoped aluminum gallium arsenide (i-$Al_xGa_{1-x}As$) layer fabricated contiguous to said channel layer;
    second spacer layer made from undoped gallium arsenide (i-GaAs) layer fabricated contiguous to said first spacer layer; and
    n-type aluminum gallium arsenide (n-$Al_xGa_{1-x}As$) layer fabricated contiguous to said second spacer layer;
    wherein:
        said second spacer layer has a thickness to prevent the diffusion of impurity from said n-type aluminum gallium arsenide layer to said channel layer;
        said channel layer and first spacer layer are forming a heterojunction;
        total thickness of said first and second spacer is thin enough to accumulate two dimensional electron gas (2DEG) in said channel layer close to said heterojunction.

2. High electron mobility semiconductor device according to claim 1, further comprising substrate made of high resistivity gallium arsenide, on which said channel layer is fabricated contiguous to the substrate.

3. High electron mobility semiconductor device according to claim 1 or 2, wherein said total thickness of said first and second spacer layer is less than 100 Å.

4. High electron mobility semiconductor device according to claim 1 or 2, wherein thickness of said second spacer layer is substantially 15–30 Å.

5. High electron mobility semiconductor device according to claim 1 or 2, wherein thickness of said first spacer layer is substantially 20–40 Å.

6. High electron mobility semiconductor device according to claim 1 or 2, wherein aluminum composition x in $Al_xGa_{1-x}As$ layer of said first spacer layer is substantially 0.3.

7. High electron mobility semiconductor device according to claim 1 or 2, wherein aluminum composition x in $Al_xGa_{1-x}As$ layer of said n-$Al_xGa_{1-x}As$ layer is substantially 0.3.

8. High electron mobility semiconductor device according to claim 1 or 2, wherein said n-type $Al_xGa_{1-x}As$ layer being doped with silicon.

9. High electron mobility semiconductor device according to claim 8, wherein dose of silicon is approximately $1 \times 10^{18}$ cm$^{-3}$.

10. High electron mobility semiconductor device according to claim 1 or 2, wherein thickness of said channel layer is approximately 0.5 μm.

11. High electron mobility semiconductor device comprising:
    substrate made of high resistivity GaAs;
    channel layer made of undoped gallium arsenide (i-GaAs) layer of approximately 0.5 μm thick;
    first spacer layer made from undoped aluminum gallium arsenide (i-$Al_xGa_{1-x}As$) layer of approximately 40 Å thick fabricated contiguous to said channel layer;
    second spacer layer made from undoped gallium arsenide (i-GaAs) layer of approximately 20 Å thick fabricated contiguous to said first spacer layer;
    first n-type aluminum gallium arsenide (n-$Al_xGa_{1-x}As$) layer of approximately 600 Å thick fabricated contiguous to said second spacer layer;
    second n-type gallium arsenide (n-GaAs) layer of approximately 500 Å thick fabricated contiguous to said first n-type aluminum gallium arsenide (n-$Al_xGa_{1-x}As$) layer;
    a recess fabricated in said second n-type gallium arsenide (n-GaAs) layer to expose the first n-$Al_xGa_{1-x}As$ layer;
    highly doped n-type regions with selenium (Se); which reach perpendicularly from the surface of the second n-GaAs layer through the channel region;
    a gate electrode contacted to said first n-$Al_xGa_{1-x}As$ layer at the recess; and
    source and drain electrodes respectively connected to said highly doped n-type regions.

* * * * *

UNITED STATES PATENT AND TRADEMARK OFFICE
CERTIFICATE OF CORRECTION

PATENT NO. : 4,593,301

DATED : June 3, 1986

INVENTOR(S) : Tsuguo INATA et al

It is certified that error appears in the above-identified patent and that said Letters Patent is hereby corrected as shown below:

Figures 2, 3, 5 and 6 should appear as on the attached sheets.

Signed and Sealed this

Thirteenth Day of January, 1987

*Attest:*

DONALD J. QUIGG

*Attesting Officer*     *Commissioner of Patents and Trademarks*